United States Patent
Hsieh

[11] Patent Number: 6,033,934
[45] Date of Patent: Mar. 7, 2000

[54] SEMICONDUCTOR CHIP FABRICATION METHOD AND APPARATUS THEREFOR

[75] Inventor: Wen-Lo Hsieh, Kaohsiung, Taiwan

[73] Assignee: Orient Semiconductor Electronics Ltd., Kaohsiung, Taiwan

[21] Appl. No.: 08/987,483

[22] Filed: Dec. 9, 1997

[51] Int. Cl.[7] .......................... H01L 21/44; H01L 21/48; H01L 21/50

[52] U.S. Cl. .......................... 438/112; 438/124; 438/126; 438/127; 438/613; 438/617

[58] Field of Search ..................................... 438/112, 124, 438/126, 127, 613, 617

[56] References Cited

U.S. PATENT DOCUMENTS 5,026,669  6/1991  Shinohara .
5,661,086  8/1997  Nakashima et al. .
5,869,355  2/1999  Fukaya .
5,885,852  3/1999  Kishikawa et al. .
5,897,338  4/1999  Kaldenberg .

*Primary Examiner*—Richard Booth
*Assistant Examiner*—Josetta I. Jones
*Attorney, Agent, or Firm*—Rosenberg, Klein & Lee

[57] ABSTRACT

A semiconductor chip fabrication method, including the steps of: (a) attaching dies to a chip carrier and then bonding lead wires to the dies, (b) adhering heat-resisting plastic strips to the chip carrier and connecting them to each die at one corner for guiding a molten resin to the dies, (c) pouring a molten resin out of nozzles of a molding apparatus, permitting the molten resin to be guided by the heat-resisting plastic strips to the dies and then molded on the dies, and (d) marking the molded dies with marks and placing them with balls, and then separating the individually molded dies from one other.

2 Claims, 2 Drawing Sheets

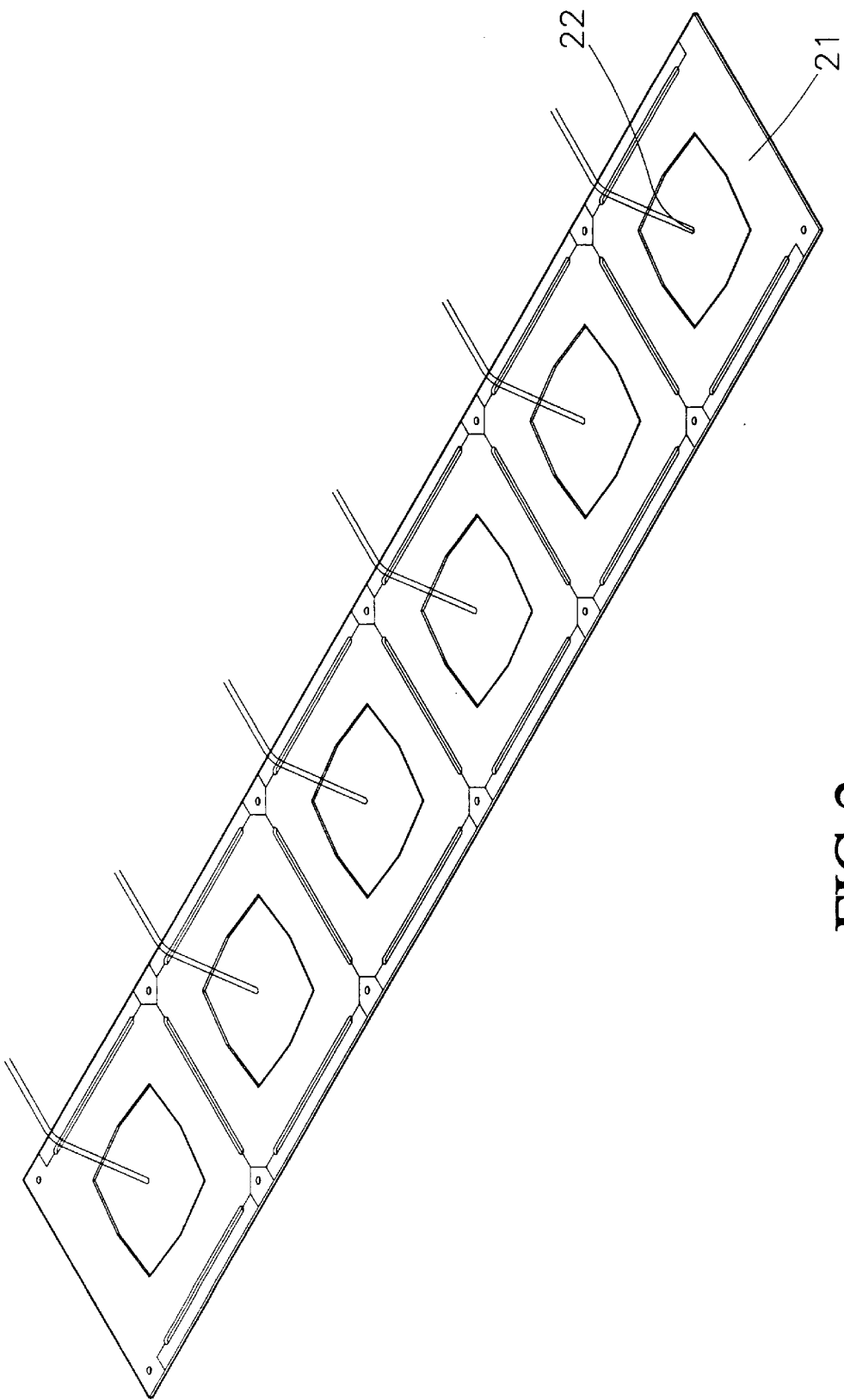

SEMICONDUCTOR CHIP FABRICATION METHOD AND APPARATUS THEREFOR

BACKGROUND OF THE INVENTION

The present invention relates to a semiconductor chip fabrication method, and more particularly to a simple and economic semiconductor chip fabrication method.

According to conventional semiconductor chip fabrication methods, dies (semiconductor chips) are provided with a respective gold plated copper foil for guiding the molten resin during molding, and the respective gold plated copper foils must be cut off when separating the individually melded semiconductor chips from each other. These methods art not economic. Further, the semiconductor chips tend to cause a short circuit during high temperature molding.

SUMMARY OF THE INVENTION

The present invention has been accomplished to provide a semiconductor chip fabrication method which eliminates the aforesaid drawbacks. According to one embodiment, the method comprises the steps of (a) attaching dies to a chip carrier and then bonding lead wires to the dies, (b) adhering heat-resisting plastic strips to the chip carrier and connecting them to each die at one corner for guiding a molten resin to the dies, (c) pouring a molten resin out of nozzles of a molding apparatus, permitting the molten resin to be guided by the heat-resisting plastic strips to the dies and then molded on the dies, and (d) marking the molded dies with marks and placing them with balls, and then separating the individually molded dies from one other. According to a second embodiment of the present invention, the method comprises the steps of: (a) adhering heat-resisting plastic strips to a chip carrier, (b) attaching dies to the chip carrier within each plastic strip and then bonding lead wires to the dies, (c) molding the dies and then removing the plastic strips from the chip carrier after molding, and (d) marking the molded dies with marks and placing the molded dies with balls, and then separating the individually molded dies from one other.

BRIEF DESCRIPTION OF THE DRAWINGS

FIG. 2 shows dies mounted within each plastic strip, nozzles attached to the dies within the plastic strip according to a second embodiment of the present invention.

DETAILED DESCRIPTION OF THE PREFERRED EMBODIMENT

Figure 1:
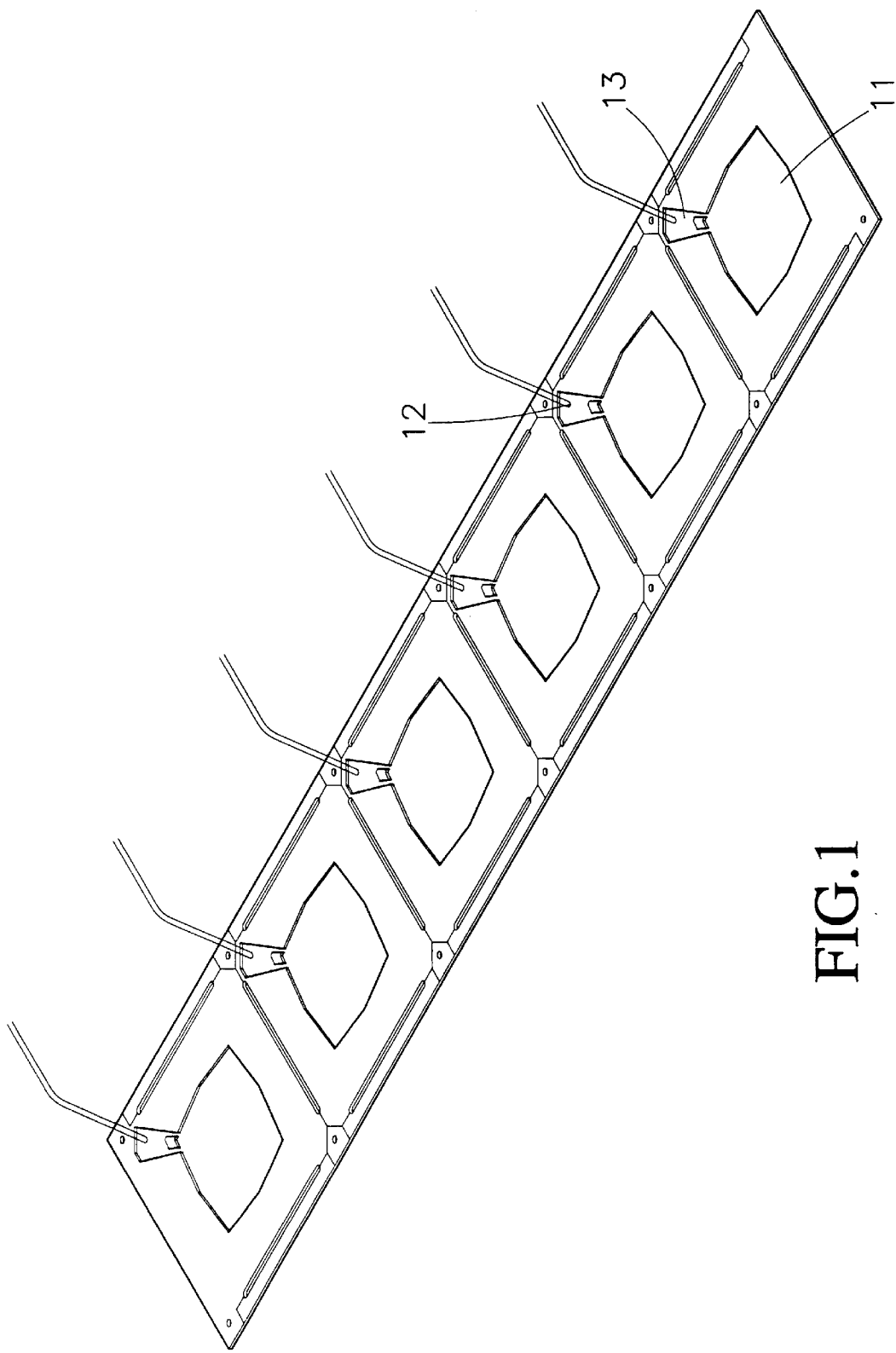
FIG. 1 shows dies attached to the chip carrier, nozzles attached plastic strips at one corner of each die according to one embodiment of the present invention.

Referring to FIG. 1, a semiconductor chip fabrication method according to one embodiment of the present invention comprises the steps of:

(a) die attach and wire bonding, where dies (tiny rectangular pieces of circular wafer of semiconductor silicon) 11 are attached to a chip carrier, and then lead wires are bonded to the dies;

(b) plastic strip adhering, where heat-resisting plastic strips 13 which define a respective longitudinal guide groove are adhered to the chip carrier and respectively connected to one corner of each die 11 for guiding a molten resin to the dies 11;

(c) molding and plastic strip removing, where nozzles 12 of a molding apparatus are respectively attached to the heat-resisting plastic strips 13, permitting a molten resin to be poured out of the nozzles 12 and guided by the heat-resisting plastic strips 13 to the dies 11 and then molded on the dies 11; and (d) marking, ball placement and singularization, where the molded dies are marked with marks and placed with balls, and then individually molded dies are separated from one other.

Referring to FIG. 2, as an alternate form of the present invention, the semiconductor chip fabrication method comprises the steps of:

(a) plastic strip adhering, where heat-resisting plastic strips 21 which are shaped like a rectangular open frame are adhered to a chip carrier;

(b) die attach and wire bonding, where dies (tiny rectangular pieces of circular wafer of semiconductor silicon) 11 are attached to the chip carrier within each plastic strip 21, and then lead wires are bonded to the dies;

(c) molding and plastic strip removing, where nozzles 22 of a molding apparatus are respectively attached to the dies 11, permitting a molten resin to be poured out of the nozzles 22 to the dies 11 and then molded on the dies 11, and the heat-resisting plastic strips 21 are removed from the chip carrier after the molding of the molten resin on the dies 11; and (d) marking, ball placement and singularization, where the molded dies are marked with marks and placed with balls, and then the individually molded dies are separated from one other.

It is to be understood that the drawings are designed for purposes of illustration only, and are not intended as a definition of the limits and scope of the invention disclosed.

What the invention claimed is:

1. A semiconductor chip fabrication method, comprising the steps of:

(a) attaching semiconductor dies to a chip carrier, and subsequently bonding lead wires to said dies;

(b) adhering a plurality of heat-resisting plastic strips to said chip carrier, each said plastic strip being connected to one corner of a respective die and extending outwardly therefrom for guiding a molten resin to said die;

(c) encapsulating said dies by respectively attaching a plurality of nozzles of a molding apparatus to said plurality of heat-resisting plastic strips, permitting a molten resin dispensed from said nozzles to be guided by said heat-resisting plastic strips to said dies and then molded on said dies;

(d) marking each said die, mounting solder balls to each said die, and then separating each individually molded die one from another; and (e) removing said heat resisting plastic strips from said chip carrier after the molding of said dies.

2. A semiconductor chip fabrication method, comprising the steps of:

(a) providing a plurality of heat-resisting plastic strips and adhering said plastic strips to a chip carrier, each of said plastic strips forming a rectangular open frame;

(b) attaching semiconductor dies to said chip carrier within a respective opening defined by each said plastic strip, and subsequently bonding lead wires to said dies;

(c) encapsulating said dies by respectively attaching a plurality of nozzles of a molding apparatus to said dies, permitting a molten resin dispensed from said nozzles to said dies and then molded on said dies, said encapsulating step including the step of removing said heat-resisting plastic strips from said chip carrier after the molding of said molten resin on said dies; and (d) marking each said die, mounting solder balls to each said die, and then separating each individually molded die one from another.

* * * * *